(12) United States Patent
Kim

(10) Patent No.: US 8,133,754 B2
(45) Date of Patent: Mar. 13, 2012

(54) IMAGE SENSOR AND METHOD FOR MANUFACTURING THE SAME

(75) Inventor: Seoung Hyun Kim, Gyeonggi-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 23 days.

(21) Appl. No.: 12/610,408

(22) Filed: Nov. 2, 2009

(65) Prior Publication Data

US 2010/0117178 A1    May 13, 2010

(30) Foreign Application Priority Data

Nov. 11, 2008  (KR) .................. 10-2008-0111416

(51) Int. Cl.
*H01L 31/14* (2006.01)
(52) U.S. Cl. .......................... 438/72; 257/432
(58) Field of Classification Search .................. 257/432
See application file for complete search history.

(56) References Cited

U.S. PATENT DOCUMENTS

| | | | |
|---|---|---|---|
| 6,927,432 B2* | 8/2005 | Holm et al. | 257/290 |
| 7,390,686 B2* | 6/2008 | Lim | 438/57 |
| 7,615,399 B2* | 11/2009 | Lee | 438/70 |
| 7,709,775 B2* | 5/2010 | Konno et al. | 250/208.1 |
| 7,787,082 B2* | 8/2010 | Ito et al. | 349/116 |
| 2004/0173866 A1* | 9/2004 | Egawa et al. | 257/462 |
| 2007/0138470 A1* | 6/2007 | Alieu et al. | 257/59 |

FOREIGN PATENT DOCUMENTS

| | | |
|---|---|---|
| JP | 2006-261372 A | 9/2006 |
| KR | 10-2005-0117674 A | 12/2005 |

* cited by examiner

*Primary Examiner* — Steven Loke
*Assistant Examiner* — David Ziskind
(74) *Attorney, Agent, or Firm* — Saliwanchik, Lloyd & Eisenschenk

(57) ABSTRACT

An image sensor is disclosed that includes a first substrate including an electric junction region, a transistor, and a metal line connected to the electric junction region or the transistor; and a photodiode formed on the first substrate. The first substrate is formed at an upper portion thereof with a reflective layer to reflect light back to the photodiode.

2 Claims, 7 Drawing Sheets

IMAGE SENSOR AND METHOD FOR MANUFACTURING THE SAME

CROSS-REFERENCE TO RELATED APPLICATION

This application claims the benefit under 35 U.S.C. §119 of Korean Patent Application No. 10-2008-0111416, filed Nov. 11, 2008, which is incorporated herein by reference in its entirety.

BACKGROUND

A CMOS image sensor according to the related art has a structure in which a photodiode and transistors are horizontally disposed.

Although disadvantages of a CCD image sensor have been overcome in the horizontal CMOS image sensor according to the related art, unsolved problems still remain in the horizontal CMOS image sensor of the related art.

In the horizontal CMOS image sensor according to the related art, the photodiode and the transistor are horizontally adjacent to each other on a substrate. Thus, an area for the photodiode is additionally required. However, a fill factor may be reduced, or resolution capability may be limited.

In the horizontal CMOS image sensor according to the related art, it is very difficult to optimize a process of simultaneously manufacturing the photodiode and the transistor. In detail, a shallow junction is required for low sheet resistance in a rapid transistor process. However, such shallow junction is unsuitable for the photodiode.

In the horizontal CMOS image sensor according to the related art, if on-chip functions are added to the CMOS image sensor, the size of a unit pixel must be increased in order to maintain the sensitivity of the image sensor, or the area of the photodiode must be reduced in order to maintain the size of a pixel.

However, if the size of the pixel is increased, the resolution of the image sensor may be reduced. If the area of the photodiode is reduced, the sensitivity of the image sensor may be reduced.

BRIEF SUMMARY

Embodiments of the present invention provide an image sensor capable of improving an integration structure of a circuitry and a photodiode and a method for manufacturing the same.

An embodiment provides an image sensor and a method for manufacturing the same employing two chips, in which the two chips are divided into an image chip and a logic chip. The image chip has a photodiode (and can be formed thereon with a color-filter array and a micro-lens) and the logic chip has a driver IC for driving the image chip and a logic array for other additional functions. The two chips are 3-D integrated.

An embodiment provides an image sensor and a method for manufacturing the same, capable of removing a plurality of metal lines from an upper portion of a photodiode, so that the distance between a photodiode and a micro-lens can be reduced to significantly reduce an optical path, thereby improving light sensitivity.

An embodiment provides an image sensor and a method for manufacturing the same, capable of improving resolution and sensitivity.

According to an embodiment, an image sensor includes a first substrate including an electric junction region, a transistor, and a metal line connected to the electric junction region or the transistor; and a photodiode formed on the first substrate. The first substrate is formed at an upper portion thereof with a reflective layer to reflect light back to the photodiode.

According to a first embodiment, a method for manufacturing an image sensor includes forming a circuitry including a metal line on a first substrate and forming a photodiode on the metal line. The forming of the circuitry on the first substrate includes forming an electric junction region and a transistor on the first substrate, forming a metal of the metal line electrically connected to the electric junction region or the transistor, forming a reflective layer and an interlayer dielectric layer on the metal, and forming a metal contact for connecting the metal with the photodiode.

According to a second embodiment, a method for manufacturing an image sensor includes forming a circuitry including a metal line on a first substrate and forming a photodiode on the metal line. The forming of the circuitry on the first substrate includes forming an electric junction region and a transistor on the first substrate, forming a first interlayer dielectric layer on the electric junction region and the transistor, sequentially forming a metal layer and a reflective layer on the first interlayer dielectric layer, forming a reflective layer pattern and a metal of the metal line connected to the electric junction region or the transistor by selectively etching the metal layer and the reflective layer, and forming a metal contact connected with the metal by forming a second interlayer dielectric layer on the reflective layer and forming a contact hole in the second interlayer dielectric layer. The contact hole can pass through the reflective layer pattern.

DETAILED DESCRIPTION

Hereinafter, an image sensor and a method for manufacturing the same according to embodiments will be described in detail with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

First Embodiment

Figure 1:
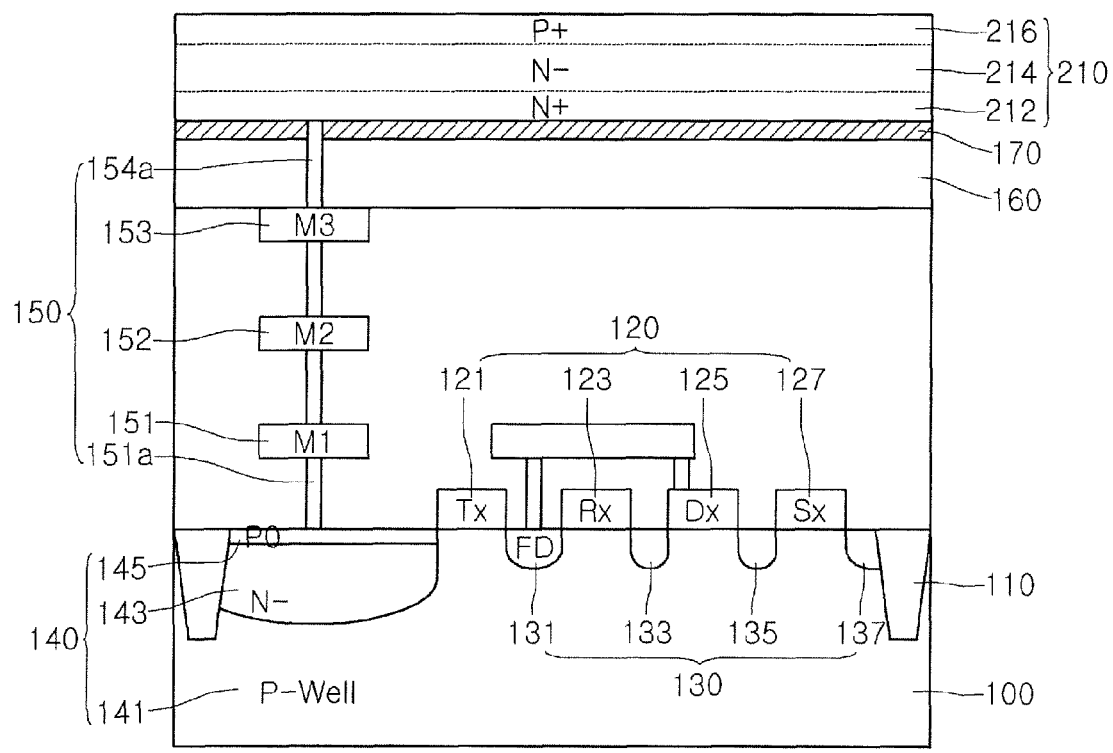
FIG. 1 is a view showing the structure of an image sensor according to a first embodiment.

FIG. 1 is a view showing the structure of an image sensor according to a first embodiment.

The image sensor according to the first embodiment includes a first substrate 100 formed thereon with a metal line 150 and a circuitry 120, and a photodiode 210 formed over the first substrate 100 while making electrical contact with the metal line 150.

The circuitry 120 of the first substrate 100 includes an electric junction region 140 and a plurality of transistors.

Figure 4:
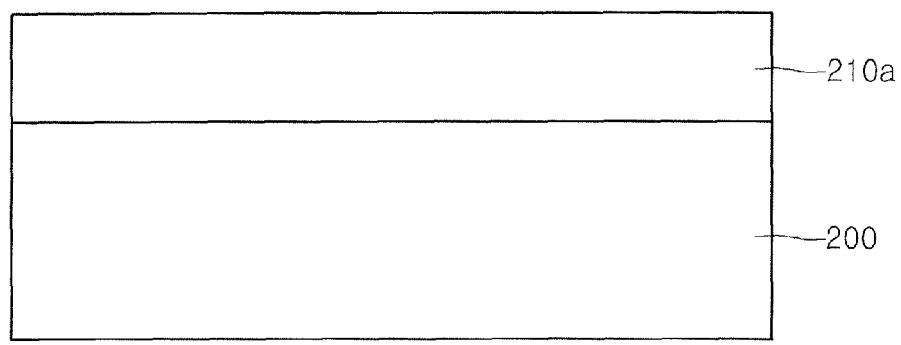

The photodiode 210 may be formed in a crystalline semiconductor layer 210a (see FIG. 4). In this case, a vertical photodiode structure, in which the photodiode 210 is placed above the circuitry 120, is employed, such that the photodiode 210 is formed in the crystalline semiconductor layer. Accordingly, defects can be reduced in the photodiode 210.

Light collected (and condensed) by a micro-lens formed over the photodiode 210 may be not incident into the photodiode 210. Therefore, to improve incidence of light into the photodiode, embodiments of the present invention include a reflective layer 170 below the photodiode 210 to reflect a visible ray back to the photodiode 210.

The forming of the reflective layer 170 will be described below in more detail.

Reference numerals which are shown in FIG. 1 but not explained will be described in a method for manufacturing the image sensor.

Hereinafter, a method for manufacturing the image sensor according to the first embodiment will be described with reference to FIGS. 2 to 7.

Figure 2:
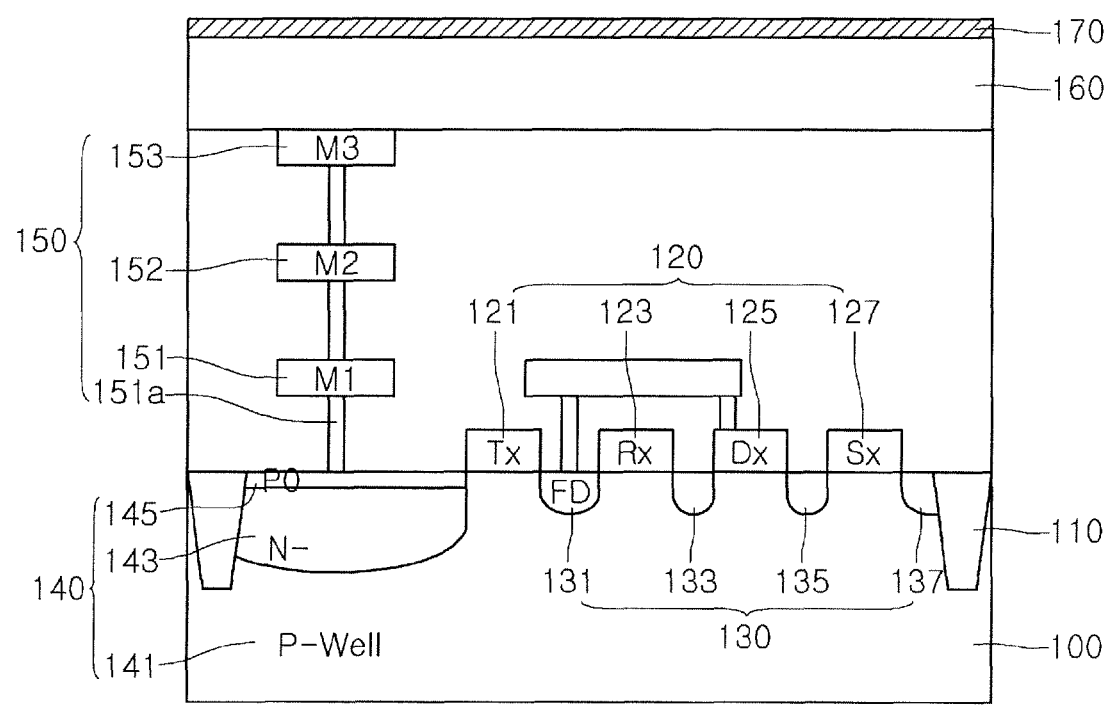
FIGS. 2 to 7 are views showing a method for manufacturing an image sensor according to the first embodiment.

As shown in FIG. 2, the first substrate 100 formed thereon with the metal line 150 and the circuitry 120 is prepared.

For example, an isolation layer 110 is formed in the first substrate 100 to define an active region, and the circuitry 120 including transistors is formed in the active region. The first substrate may include a second conductive type. The circuitry 120 may include a transfer transistor (Tx) 121, a reset transistor (Rx) 123, a drive transistor (Dx) 125, and a select transistor (Sx) 127.

An ion implantation region 130 including a floating diffusion region (FD) 131 and source/drain regions 133, 135, and 137 may be formed in the first substrate 100.

An electric junction region 140 can be a PN junction. The electric junction region 140 may include a first conductive-type ion implantation layer 145 formed on a second conductive-type ion implantation layer 143. The second conductive-type ion implantation layer 143 can be formed on a first conductive-type well 141 (or epitaxial layer).

For example, the PN junction 140 may be a P0 145/N− 143/P− 141 junction region as shown in FIG. 2, but the embodiment is not limited thereto.

Reasons for forming the P0/N−/P− junction 140, which acts as a photodiode in a four transistor CMOS image sensor (4 T CIS) structure of FIG. 2, on the Si substrate 100 are as follows.

Different from the FD node 131 having an N+ junction, the P0/N−/P− junction 140 delivers only a portion of applied voltage and is pinched off at a predetermined voltage. This voltage for the pinch-off is called the pinning voltage, and the pinning voltage depends on the doping concentration of the P0 layer 145 and the N− layer 143.

In detail, electrons generated from the photodiode 210 are moved into the P0/N−/P− junction 140. When the Tx 121 is turned on, the electrons are delivered into the FD node 131 so that the electrons are converted into voltage.

Since the maximum voltage of the P0/N−/P− junction 140 becomes the pinning voltage, and the maximum voltage of the FD node 131 is Vdd minus the threshold voltage (Vth) of the Rx transistor 123, electrons generated from the photodiode 210 positioned above a chip can be fully dumped into the FD node 131 without charge sharing due to potential difference between the source and drain terminals of the Tx transistor 121.

According to an embodiment, by using the P0/N−/P− junction 140 instead of an N+ junction for collection of photocharges of the photodiode, saturation signals and sensitivity degradation can be inhibited from occurring.

Next, an interlayer dielectric layer and a metal line 150 can be formed on the first substrate 100. The metal line 150 may include a first metal contact 151a, a first metal 151, a second metal 152, a third metal 153, and a fourth metal contact 154a, but the embodiment is not limited thereto.

Processes of forming the metals and the metal contacts are generally known to those skilled in the art. Since the reflective layer 170 is formed after the third metal 153 is formed in the embodiment illustrated in FIG. 2, the interlayer dielectric layer formed after the third metal 153 will be represented with reference numeral 160.

In other words, as shown in drawings, after the third metal 153 has been formed, the interlayer dielectric layer 160 is formed with a predetermined thickness on the first substrate 100. The reflective layer 170 is formed on the interlayer dielectric layer 160 to reflect light.

The reflective layer 170 can include materials such as silver (Ag) to reflect a visible ray. The reflective layer 170 may include other metallic materials or non-metallic materials to reflect a visible ray.

Figure 3:
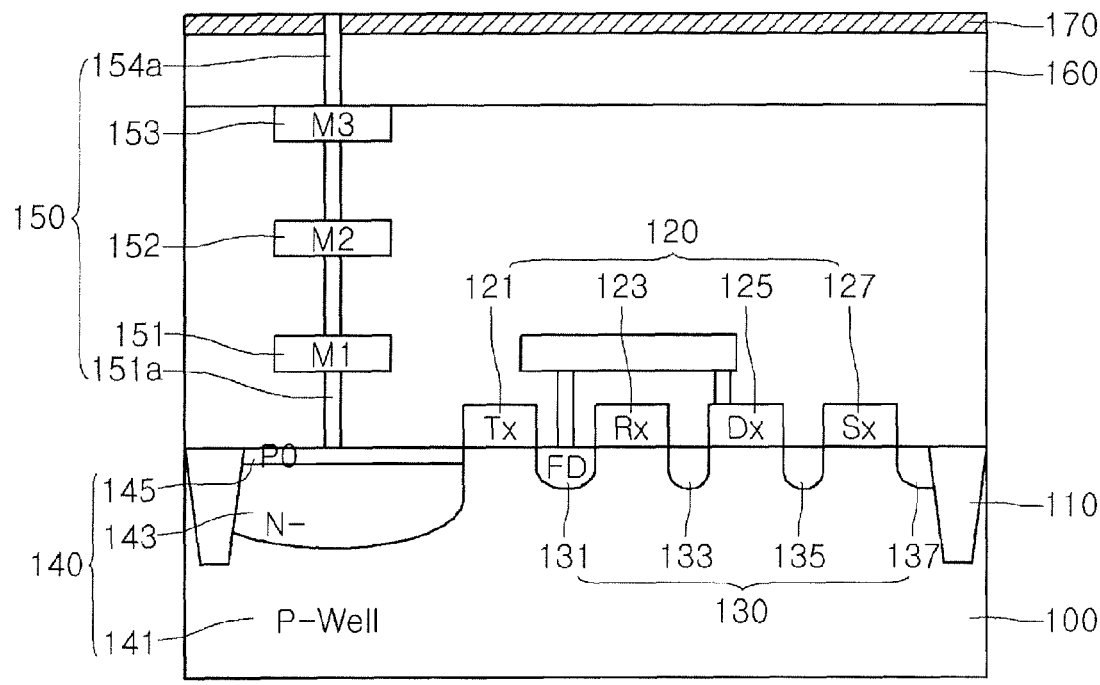

Next, referring to FIG. 3, a process of forming the fourth metal contact 154a to electrically connect the third metal 153 with the photodiode 210 is performed.

According to an embodiment, after selectively etching the reflective layer 170 and the interlayer dielectric layer 160 formed over the third metal 153, metal is gap-filled in the etched region to form the fourth metal contact 154a.

Referring to FIG. 4, a crystalline semiconductor layer 120a is formed on a second substrate 200. The photodiode 210 is formed in the crystalline semiconductor layer 210 to reduced defects in the photodiode 210.

For example, in one embodiment, the crystalline semiconductor layer 210a is formed on the second substrate 200 through an epitaxial process. Next, hydrogen ions are implanted into the boundary between the second substrate 200 and the crystalline semiconductor layer 210a, so that a hydrogen ion implantation layer may be formed at an upper portion of the second substrate 200. In another embodiment, the hydrogen ions may be implanted after an ion implantation process has been performed to form the photodiode 210.

Figure 5:
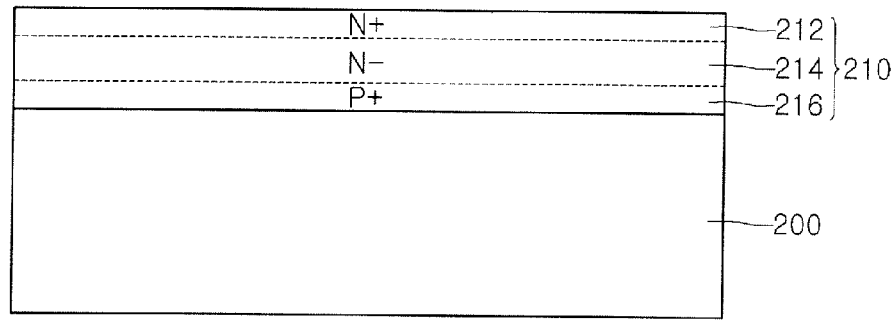

Referring to FIG. 5, a plurality of ions are implanted into the crystalline semiconductor layer 210a to form the photodiode 210 for receiving light to generate an electrical signal.

According to an embodiment, a first impurity region 216 implanted with first conductive-type impurities is formed at a lower portion of the crystalline semiconductor layer 210a. For example, a blanket ion implantation process is performed with respect to an entire surface of the second substrate 200 without aligning a mask above the crystalline semiconductor layer 210a, thereby forming a high-concentration P-type impurity region 216.

Next, a second impurity region 214 implanted with second conductive-type impurities is formed on the first impurity region 216. For example, a blanket ion implantation process may be performed with respect to the entire surface of the second substrate 200 by using second conductive-type impurities without aligning a mask above the first impurity region 216, thereby forming the low-concentration N-type impurity region 214. For example, the low-concentration second impurity region 214 may have a junction depth in the range of about 1.0 µm to about 2.0 µm.

A third impurity region 212 implanted with high-concentration second conductive-type impurities may be further formed on the second conductive-type impurity region 214. For example, a blanket ion implantation process is performed with respect to the entire surface of the second substrate 200 without a mask to form the high-concentration N+ type impurity region 212 on the second impurity region 214 implanted with the second conductive-type impurities, thereby contributing to ohmic-contact.

Figure 6:
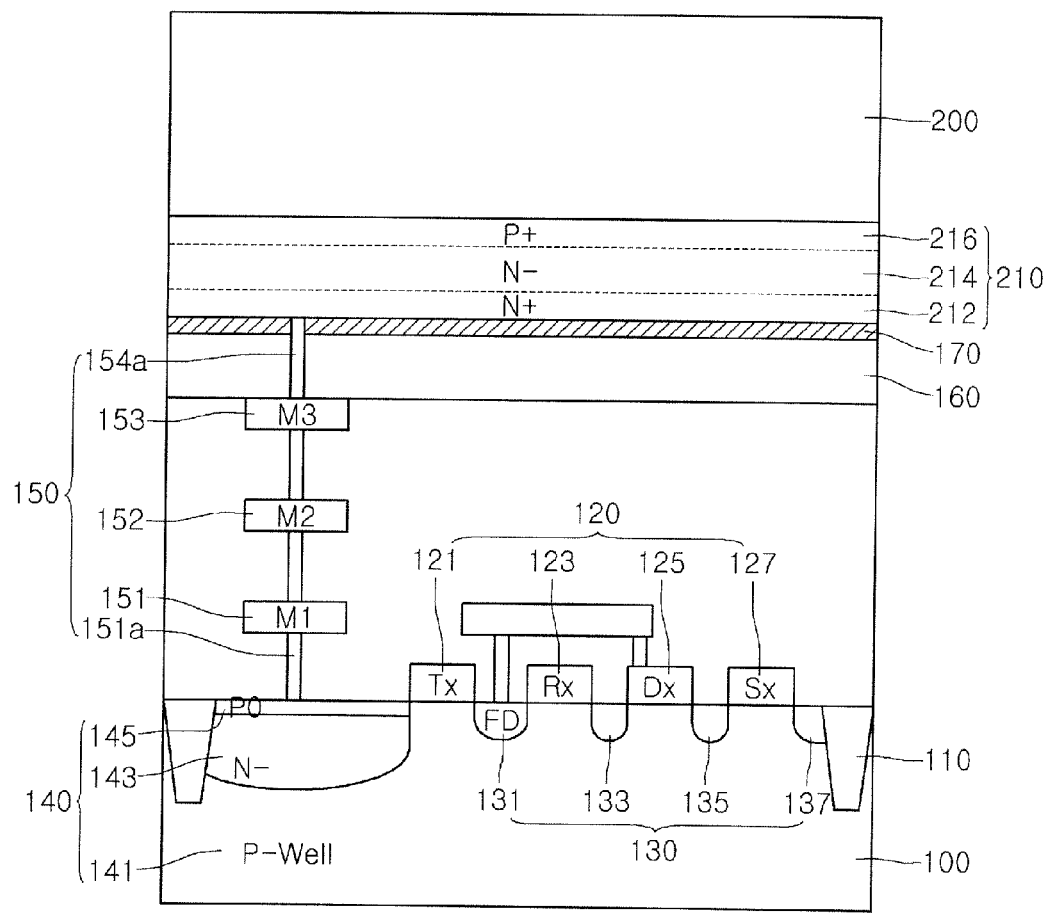

Referring to FIG. 6, the first substrate 100 is bonded with the second substrate 200 such that the photodiode 210 can make contact with the metal line 150.

For example, before the first substrate 100 is bonded with the second substrate 200, surficial energy of a bonded surface may be increased by plasma activation.

After bonding the first substrate 100 with the second substrate 200, heat treatment is performed with respect to the second substrate 200, so that a region of the second substrate 200 implanted with hydrogen ions can be converted into a hydrogen gas layer (not shown).

Figure 7:
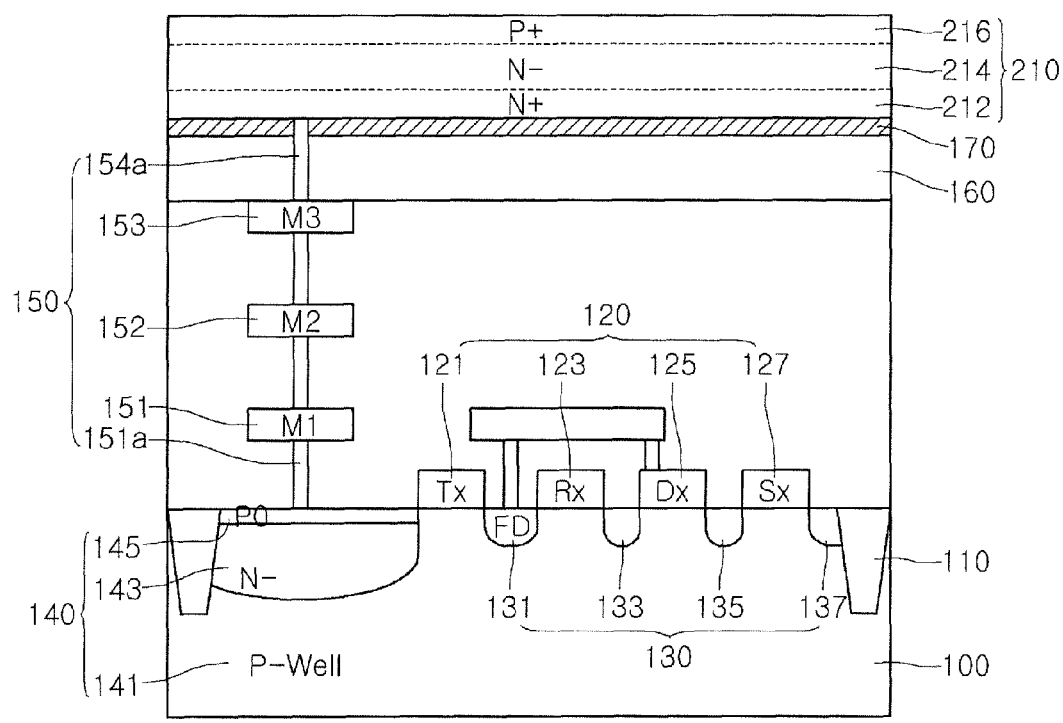

Thereafter, referring to FIG. 7, the second substrate 200 above the hydrogen gas layer is removed by using a blade, such that the photodiode 210 is exposed.

An etch process can be performed with respect to the photodiode 210 such that the photodiode 210 is divided according to pixels. Then, an insulating layer (not shown) may be filled in the etched portion between pixels. Thereafter, processes for an upper electrode (not shown) and a color filter (not shown) may be performed.

According to the image sensor of the first embodiment, even if light incident onto a region between unit pixels is not directly received in the photodiode region, the light is reflected by the reflective layer 170 to be incident onto the photodiode 210. Accordingly, the light receiving capability of the photodiode 210 can be improved.

Second Embodiment

Figure 8:
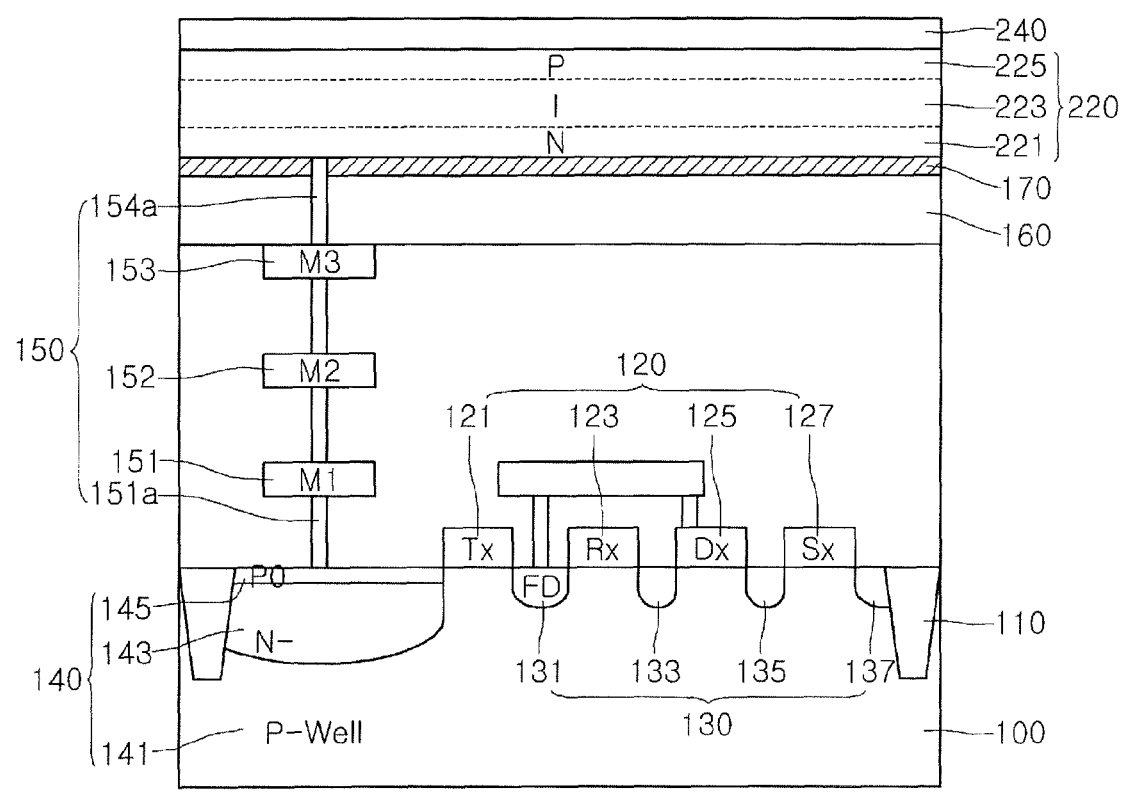
FIG. 8 is a view showing the structure of an image sensor according to a second embodiment.

FIG. 8 is a view showing the structure of an image sensor according to the second embodiment.

The image sensor according to the second embodiment includes the first substrate 100 formed thereon with the metal line 150 and the circuitry 120, and includes a photodiode 220 formed over the first substrate 100 while making contact with the metal line 150.

Even though a single photodiode is shown in FIG. 8 corresponding to a unit pixel, the reflective layer 170 is formed at an upper portion of metal of the metal line 150 to reflect light passing through a region between unit pixels.

The circuitry 120 of the first substrate 100 includes the electric junction region 140 and a plurality of transistors formed in the first substrate 100.

The second embodiment may employ technical features of the first embodiment.

Different from the first embodiment, the photodiode 220 may be formed on an amorphous layer according to the second embodiment.

For example, the photodiode 220 includes an intrinsic layer 223 electrically connected with the metal line 150 and a first conductive type conductive layer 225 implanted with first conductive-type materials and formed on the intrinsic layer 223.

According to the second embodiment, a second conductive-type conductive layer 221 implanted with a second conductive-type material may be additionally formed between the metal line 150 and the intrinsic layer 223.

The reflective layer 170 is formed between the metal line 150 and the second conductive-type conductive layer 221 to reflect a visible ray, and the visible ray reflected from the reflective layer 170 is incident onto the region of the photodiode 220.

Hereinafter, the forming of the photodiode 220 according to the second embodiment will be described.

Different from the first embodiment, the second embodiment employs a scheme of forming the photodiode 220 on the first substrate 100 having the circuitry 120 including the metal line 150 through a deposition scheme instead of employing a scheme of bonding substrates with each other.

For example, the second conductive-type conductive layer 221 implanted with the second conductive-type material is formed on the first substrate 100 such that the second conductive-type conductive layer 221 makes contact with the metal line 150. In another embodiment, the subsequent process may be performed without forming the second conductive-type conductive layer 221.

The second conductive-type conductive layer 221 can serve as an N layer of a PIN diode according to the second embodiment. In other words, the second conductive-type conductive layer 221 may be an N-type conductive-type conductive layer, but the embodiment is not limited thereto.

The second conductive-type conductive layer 221 may be formed by using n-doped amorphous silicon, but the embodiment is not limited thereto.

According to certain embodiments, the second conductive-type conductive layer 221 includes a-Si:H, a-SiGe:H, a-SiC, a-SiN:H, or a-SiO:H obtained by doping amorphous silicon with germanium (Ge), carbon (C), nitrogen (N), or oxygen (O)

The second conductive-type conductive layer 221 may be formed through a chemical vapor deposition (CVD) process, such as a plasma enhanced chemical vapor deposition (PECVD) process. For example, the second conductive-type conductive layer 221 can be formed using amorphous silicon through the PECVD process by applying a mixture of silane gas ($SiH_4$) and $PH_3$ or $P_2H_5$.

Next, an intrinsic layer 223 is formed on the second conductive-type conductive layer 221. The intrinsic layer 223 may serve as an I layer of a PIN diode according to the embodiment. For embodiments omitting the second conductive-type conductive layer 221, the intrinsic layer 223 can be formed on the first substrate 100 such that the intrinsic layer 223 makes contact with the metal line 150.

The intrinsic layer 223 may be formed by using amorphous silicon. The intrinsic layer 223 may be formed through a CVD process, such as a PECVD process. For example, the intrinsic layer 223 may be formed using amorphous silicon through the PECVD process by applying $SiH_4$.

Thereafter, a first conductive-type conductive layer 225 is formed on the intrinsic layer 223. The first conductive-type conductive layer 225 may be formed subsequently to the forming of the intrinsic layer 223. The first conductive-type conductive layer 225 may serve as a P layer of the PIN diode according to the second embodiment. In other words, the first conductive-type conductive layer 225 may be a P-type conductive layer, but the embodiment is not limited thereto.

The first conductive-type conductive layer 225 may be formed by using p-doped amorphous silicon, but the embodiment is not limited thereto.

The first conductive-type conductive layer 225 may be formed through a CVD process, such as a PECVD process. For example, the first conductive-type conductive layer 225 may be formed using amorphous silicon through the PECVD process by applying a mixture of $SiH_4$ and boron (B).

An upper electrode 240 may be formed on the first conductive-type conductive layer 225. For example, the upper electrode 240 may include a transparent electrode having high light transmittance and high conductivity. For example, the upper electrode 240 may include indium tin oxide (ITO) or cadmium tin oxide (CTO).

According to the image sensor and the method for manufacturing the same of the second embodiment, the circuitry 120 and the photodiode 220 can be vertically integrated with each other.

Third Embodiment

Figure 9:
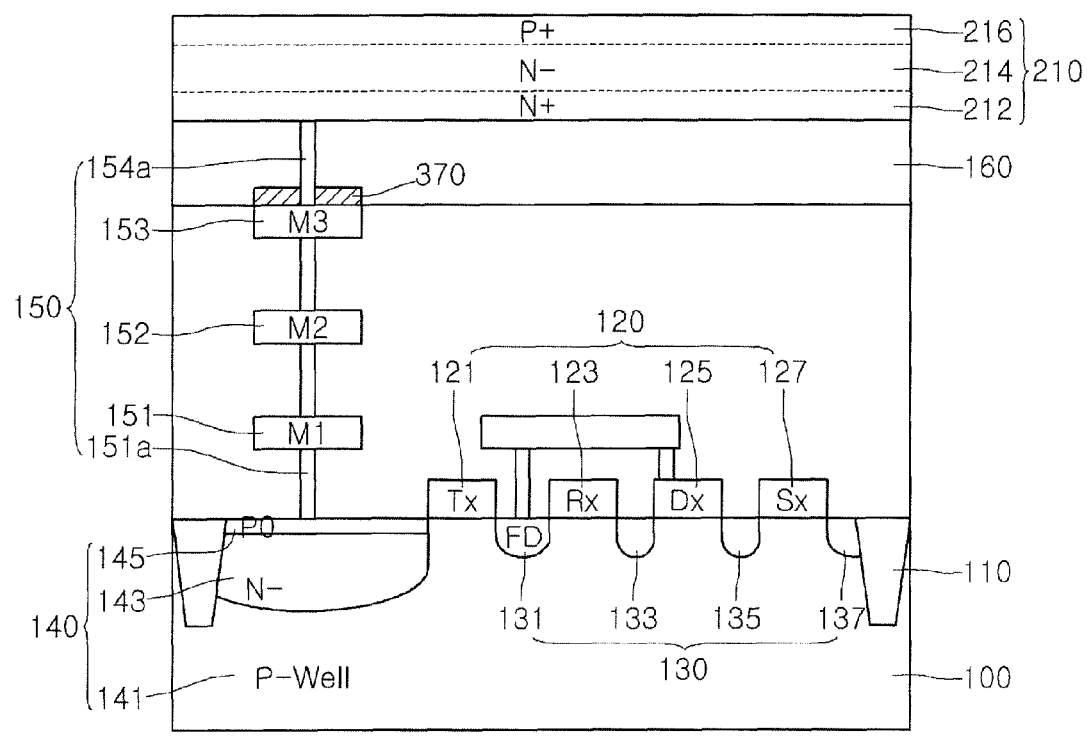
FIG. 9 is a view showing the structure of an image sensor according to a third embodiment.

FIG. 9 is a view showing the structure of an image sensor according to a third embodiment.

As shown in FIG. 9, the image sensor according to the third embodiment includes a reflective layer 370 formed on a top surface of a metal pattern to reflect light below a photodiode region.

Details the same as those of FIGS. 1 to 7 will be omitted in order to avoid redundancy except that the reflective layer 370 is formed together with the third metal 153.

The reflective layer 370 includes metal materials or non-metal materials to reflect a visible ray. After a metal layer for the third metal 153 has been formed on an interlayer dielectric layer (not shown), the reflective layer 370 is formed on the metal layer.

While forming the metal pattern by etching a portion of the metal layer, the reflective layer 370 is etched, so that the reflective layer 370 is placed on the top surface of the third metal 153.

In such an image sensor, after light incident onto a region between unit pixels has been reflected by the reflective layer 370, the light travels toward the photodiode 210, so that light sensitivity can be improved.

Even if light incident onto a region between unit pixels is not received in the photodiode region, the light is reflected by the reflective layer 370 to be incident onto the photodiode 210. Accordingly, the light receiving capability of the photodiode 210 can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, the method comprising:
   forming a circuitry including a metal line on a first substrate; and
   forming a photodiode on the metal line,
   wherein the forming of the circuitry on the first substrate comprises:
   forming an electric junction region and a transistor on the first substrate;
   forming a first interlayer dielectric layer on the electric junction region and the transistor;
   forming a metal layer and a reflective layer on the first interlayer dielectric layer sequentially;
   forming a reflective layer pattern and a metal pattern connecting the electric junction region or the transistor by selectively etching the metal layer and the reflective layer;
   forming a second interlayer dielectric layer on the reflective layer pattern;
   forming a contact hole in the second interlayer dielectric layer and the reflective layer pattern; and
   forming a metal contact in the contact hole passing through the reflective layer pattern and the second interlayer dielectric layer, the metal contact contacting a lower surface of the photodiode.

2. The method of claim 1, wherein the reflective layer pattern contacts the top surface of the metal pattern when the metal pattern and the reflective layer pattern are formed.

* * * * *